United States Patent
Nikoukary et al.

(10) Patent No.: US 12,300,303 B2
(45) Date of Patent: May 13, 2025

(54) SIGNAL SKEW IN SOURCE-SYNCHRONOUS SYSTEM

(71) Applicant: Rambus Inc., San Jose, CA (US)

(72) Inventors: Shahram Nikoukary, Mountain View, CA (US); Jonghyun Cho, Saratoga, CA (US); Anand Jai, San Jose, CA (US); Pradeep Batra, Santa Clara, CA (US); Lei Luo, Chapel Hill, NC (US)

(73) Assignee: Rambus Inc., San Jose, CA (US)

(*) Notice: Subject to any disclaimer, the term of this patent is extended or adjusted under 35 U.S.C. 154(b) by 0 days.

(21) Appl. No.: 18/673,246

(22) Filed: May 23, 2024

(65) Prior Publication Data

US 2024/0395310 A1 Nov. 28, 2024

Related U.S. Application Data (63) Continuation of application No. 17/309,770, filed as application No. PCT/US2019/065787 on Dec. 11, 2019, now Pat. No. 12,027,197.

(60) Provisional application No. 62/783,901, filed on Dec. 21, 2018.

(51) Int. Cl.
| | |
|---|---|
| *G11C 11/4076* | (2006.01) |
| *G06F 3/06* | (2006.01) |
| *G11C 7/22* | (2006.01) |

(52) U.S. Cl.
CPC ........ *G11C 11/4076* (2013.01); *G06F 3/0604* (2013.01); *G06F 3/0659* (2013.01); *G06F 3/0673* (2013.01); *G11C 7/22* (2013.01); *G11C 7/222* (2013.01)

(58) Field of Classification Search
CPC ....... G11C 11/4076; G11C 7/22; G11C 7/222; G06F 3/0604; G06F 3/0659; G06F 3/0673

USPC .......................................................... 711/154
See application file for complete search history.

(56) References Cited

U.S. PATENT DOCUMENTS

| | | | |
|---|---|---|---|
| 4,788,667 | A | 11/1988 | Nakano et al. |
| 6,611,217 | B2 | 8/2003 | Buchanan et al. |
| 7,275,201 | B1 | 9/2007 | Porat et al. |
| 9,128,632 | B2 | 9/2015 | Lee et al. |
| 9,639,281 | B1 * | 5/2017 | Shallal ................. G11C 7/08 |

(Continued)

OTHER PUBLICATIONS

Notification of Transmittal of the International Search Report and the Written Opinion of the International Searching Authority, or the Declaration with Mail Date Mar. 30, 2020 re: Int'l Appln. No. PCT/US2019/065787. 16 pages.

*Primary Examiner* — Viet Q Nguyen
(74) *Attorney, Agent, or Firm* — Lowenstein Sandler LLP (57) ABSTRACT

A memory controller integrated circuit includes a clock signal generator circuit configured to generate a plurality of strobe signals. The memory controller integrated circuit further includes a memory interface circuit coupled to the clock signal generator circuit, the memory interface circuit configured to transmit the plurality of strobe signals to a memory module, wherein each of the plurality of strobe signals is offset with respect to an adjacent strobe signal, and transmit a plurality of data signals to the memory module, wherein a first subset of the plurality of data signals comprises a first nibble and is phase aligned with a first strobe signal of the plurality of strobe signals, and wherein a second subset of the plurality of data signals comprises a second nibble and is phase aligned with a second strobe signal of the plurality of strobe signals.

20 Claims, 8 Drawing Sheets

(56) References Cited

U.S. PATENT DOCUMENTS

| | | |
|---|---|---|
| 10,698,440 B2 | 6/2020 | Carlough et al. |
| 10,789,185 B2 | 9/2020 | Giovannini et al. |
| 11,513,955 B2 | 11/2022 | Lee et al. |
| 11,574,661 B1 * | 2/2023 | Mazumder ............ G11C 11/4076 |
| 11,705,187 B2 | 7/2023 | Ware et al. |
| 11,755,508 B2 | 9/2023 | Ware et al. |
| 11,809,345 B2 | 11/2023 | Giovannini et al. |
| 12,027,197 B2 * | 7/2024 | Nikoukary ............ G06F 3/0673 |
| 2006/0294294 A1 | 12/2006 | Walker |
| 2007/0186072 A1 * | 8/2007 | Woo ..................... G06F 13/4243 |
| | | 711/167 |
| 2009/0244997 A1 | 10/2009 | Searles et al. |
| 2012/0159061 A1 * | 6/2012 | Hampel .............. G06F 13/4243 |
| | | 711/E12.001 |
| 2016/0148671 A1 | 5/2016 | Ware |
| 2016/0180901 A1 | 6/2016 | Oh et al. |
| 2019/0379564 A1 * | 12/2019 | Giovannini ........... G06F 3/0644 |
| 2020/0089431 A1 * | 3/2020 | Jung .................. G11C 11/4096 |

\* cited by examiner

SIGNAL SKEW IN SOURCE-SYNCHRONOUS SYSTEM

RELATED APPLICATIONS

This application is a continuation of U.S. patent application Ser. No. 17/309,770 filed Jun. 17, 2021, which is a 371 application of International Application No. PCT/US2019/065787, filed Dec. 11, 2019, which claims the benefit of U.S. Provisional Patent Application No. 62/783,901, filed Dec. 21, 2018, each of which is incorporated herein by reference.

BACKGROUND

Modern computer systems generally include a data storage device, such as a memory component. The memory component may be, for example a random access memory (RAM) or a dynamic random access memory (DRAM). The memory component includes memory banks made up of memory cells which are accessed by a memory controller or memory client through a command interface and a data interface within the memory component.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

In a source-synchronous system, data signals sent from a source (e.g., a memory controller) to a receiver (e.g., a buffer chip on a memory module) are synchronized to strobe signals (which also may be referred to as clock signals) provided by the source and transmitted along with the data signals. Certain systems strive to make skew among signals (i.e., the difference in time at which the signals arrive at different components in the system) as small as possible in order to allow for a larger timing margin. In such a synchronous system, where multiple data signals are transmitted on adjacent signal lines, signal-to-signal crosstalk (e.g., interference) may occur at the rising and/or falling edges of the corresponding clock signal and affect slew and timing margin.

In a double data rate (DDR) memory system, there may be, for example, eight data signals transmitted from the memory controller to the memory module, with one bit from each of the eight signals forming a byte of data written to the memory module. Each four bit aggregation (i.e., each nibble) may have a corresponding clock signal (e.g., a differential clock signal) used as a reference clock to transfer the signals. Within each nibble, the four data signals are synchronized to the same clock, however, all signals need to be synchronized in the synchronous system. Accordingly, many systems perform a nibble-skew alignment operation to cause all data signals (DQ) and clock signals (DQS) to be synchronized at the receiver.

Such a system, however, can experience a number of drawbacks related to signal and power integrity. For example, when multiple signals switch states at the same time, due to the synchronization described above, a significant amount of power noise is generated in the system. In addition, the clock signal generally has a 90-degree phase offset compared to the data signals and, thus, clock signal to data signal crosstalk can contribute to the additive noise in the system.

Aspects of the present disclosure address the above and other considerations by introducing some amount of skew among signals in a source-synchronous system. In one embodiment, the nibble-skew alignment operations generally performed are deactivated and/or eliminated, allowing for some amount of skew between nibbles. As a result, there may be skew present between different groups of four signals (i.e., nibbles), while the four signals within each individual group remain aligned. The memory controller may further create a specific amount of skew in the clock signals based on an amount of interference attributable to the transitions in the signals propagating on the signal lines between the memory controller and memory module. By introducing skew between nibble groups there will be a signal offset, but the memory device (e.g., a dynamic random access memory (DRAM) device) or data buffer chip within the memory module can easily accommodate the offset with minimal increased latency. Such skew between nibble groups should not affect the timing margin because the data signals and clock signal remain synchronized within each nibble. As a result of the nibble skew offset, all signals in the system no longer switch at same time, which reduces peak power noise and results in an improved eye opening (i.e., representing additive noise in the signal) for an eye pattern diagram of the data signals at the receiver. The intentional skewing scheme for data signals described herein can be applied to any synchronous system including those using a phase interpolator (PI) for training, such as high bandwidth memory (HBM), Graphics DDR (GDDR) 5, GDDR 6, etc., or any other system including some other circuit, component, logic, etc. configured to control signal skew (referred to herein as a "delay circuit"), and can be expected to reduce power/ground noise with minimal increased latency inside the chip.

In the source-synchronous system, command and address signals are also synchronized to a clock signal. The command and address signals may be synchronized with a free running clock signal, as opposed to the data signals which are synchronized to a strobe signal that only bursts while the data signals are actively being transferred. With only a single clock signal used for a potentially large number of command and address signals, a similar situation may exist where all of the command and address signals transition together, thereby generating large power/ground noise. To reduce this amount of power/ground noise at signal transition without sacrificing the timing margin, an intentional skewing scheme can be introduced for the command and address signals as well. In one embodiment, the memory controller is configured to divide the command and address signals into two or more groups and introduces some delay in the transmission of signals from the groups to prevent all of the signals from switching at the same time. For example, a command buffer (e.g., a register clock driver (RCD)) of the memory module may receive the clock signal from the memory controller source, and generate, within the memory module, a delayed signal corresponding to the skew of one of the signal groups. The skewed signal group can be sampled with the delayed clock in order to achieve reduced power/ground noise without sacrificing timing margin. The minimal increase in latency and amount of additional circuitry used to generate the clock delay is not a significant burden for most memory systems.

The intentional skewing scheme for command and address signals described herein can be applied to any components in a source-synchronous system. For example, in one implementation, there may be 14 command and address signals with one reference clock. In one embodiment, the command buffer of the memory module can group the command and address signals into two groups of seven signals each and can introduce some intentional skew between these two groups. A delayed clock signal inside the command buffer of the memory module chip can be used for sampling the skewed command and address signal group. In other embodiments, there can be any number of command and address signal groups and corresponding delayed clock signals. The number of signal groups, which signals are in each group, and the signal skew between the signal groups, can all be optimized to limit power/ground noise shapes and crosstalk among signals in the system. Additional details of intentional signal skew in a source-synchronous system are provided below with respect to FIGS. 1-8.

Figure 1:
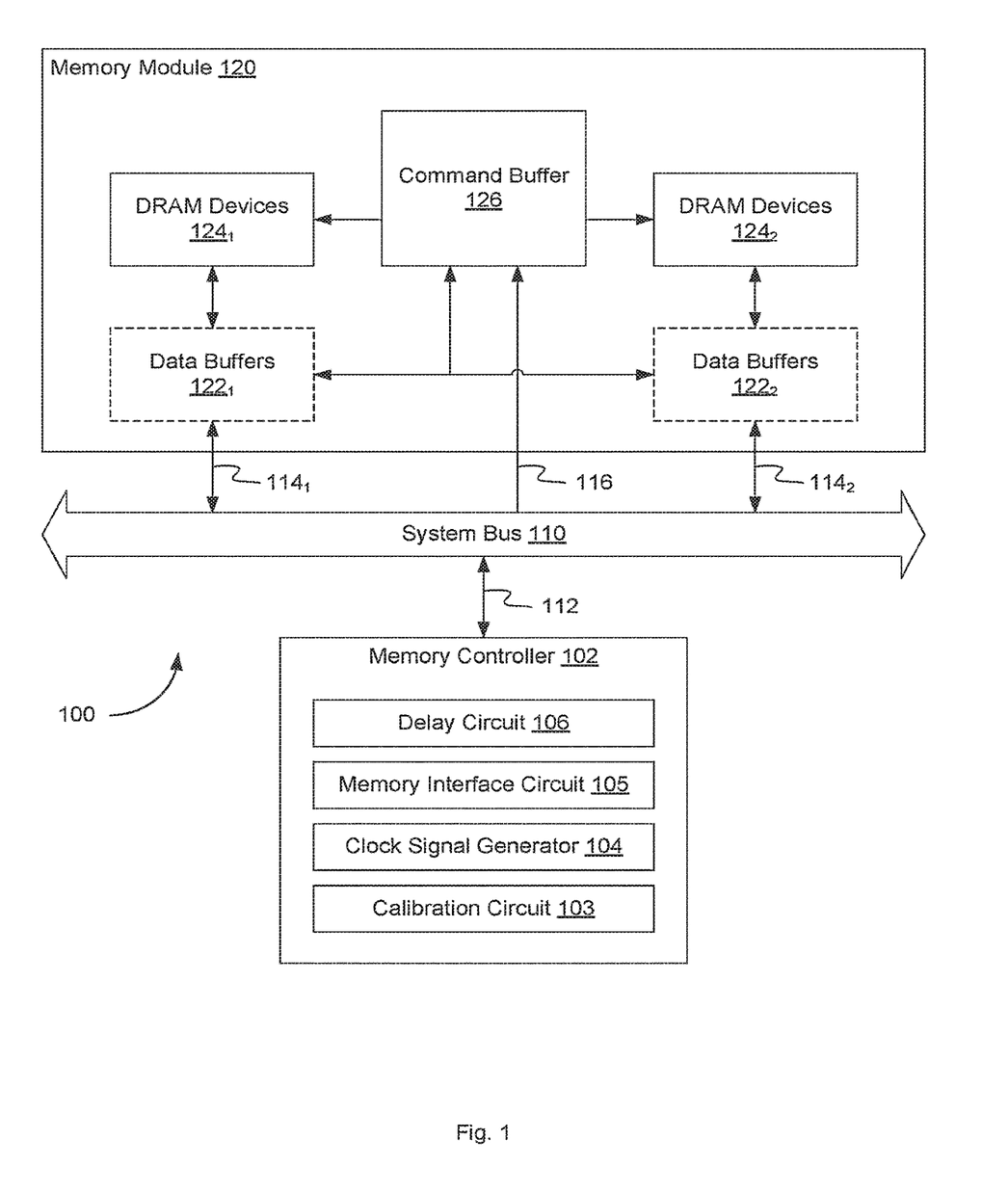
FIG. 1 is a block diagram illustrating a computing environment with a memory controller configured to introduce intentional skew in a source-synchronous memory system, according to an embodiment.

FIG. 1 depicts an environment 100 showing a memory module 120. As an option, one or more instances of environment 100 or any aspect thereof may be implemented in the context of the architecture and functionality of the embodiments described herein.

As shown in FIG. 1, environment 100 comprises a memory controller 102 coupled to a memory module 120 through a system bus 110. In one embodiment, memory module 120 is a dual in-line memory module (DIMM). Such memory modules can be referred to as DRAM DIMMs, registered DIMMs (RDIMMs), or load-reduced DIMMs (LRDIMMs), and can share a memory channel with other DRAM DIMMs.

In on embodiment, the memory controller 102 further comprises a calibration circuit 103, a clock signal generator 104, a memory interface circuit 105, and a delay circuit 106. Memory controller 102 can comprise multiple instances each of calibration circuit 103, clock signal generator 104, memory interface circuit 105, and delay circuit 106. The memory controller 102 can further include a cache memory, which can be dedicated to a single processing core or shared with other cores. Clock signal generator 104 may include a phase lock loop (PLL) or other circuit to generate one or more clock signals. In other embodiments, clock signal generator 104 may receive one or more clock signals from a source external to the memory controller 102. In either embodiment, memory interface circuit 105 may include a driver to drive the one or more clock signals from clock signal generator 104 off of memory controller 102 (e.g., to components such as RCD or Buffer chips on memory module 120).

The memory interface circuit 105 of the memory controller 102 communicates with the memory module 120 through the system bus 110 using a physical interface 112 (e.g., to communicate with DRAM devices compliant with the JEDEC standard, etc.). Specifically, the memory interface circuit 105 can write data to and/or read data from multiple sets of DRAM devices $124_1$-$124_2$ using a data bus $114_1$ and a data bus $114_2$, respectively. For example, the data bus $114_1$ and the data bus $114_2$ can transmit the data as electronic signals such as a data signal, a chip select signal, and/or a data strobe signal. As described in more detail below, in one embodiment, data bus $114_1$ and data bus $114_2$ can each include two or more groups of multiple data signals (e.g., four data signals per group), with each group having a corresponding strobe signal or signals, generated by clock signal generator 104. In one embodiment, based on a determination by calibration circuit 103, delay circuit 106 (e.g., a phase interpolator) skews the strobe signals of one group of data signals by a certain offset amount with respect to the strobe signals of the other group of data signals. Memory interface circuit 105 then transmits the data signals together with the strobe signals having this intentional skew to memory module 120 over system bus 110 and either data bus $114_1$ or data bus $114_2$.

The DRAM devices $124_1$-$124_2$ in memory module 120 can each comprise an array of eight or nine memory devices (e.g., SDRAM) arranged in various topologies (e.g., A/B sides, single-rank, dual-rank, quad-rank, etc.). In some cases, as shown, the data to and/or from the DRAM devices $124_1$-$124_2$ can optionally be buffered by a set of data buffers $122_1$ and data buffers $122_2$, respectively. Such data buffers can serve to redrive the signals (e.g., data or DQ signals, etc.) on the system bus 110 to help mitigate high electrical loads of large computing and/or memory systems. In other embodiments, data buffers $122_1$ and data buffers $122_2$ are not present in memory module 120.

Further, command/address signals from the memory interface circuit 105 can be received by a command buffer 126, such as a register clock driver (RCD), at the memory module 120 using a command and address (CA) bus 116. For example, the command buffer 126 might be an RCD such as included in registered DIMMs (e.g., RDIMMs, LRDIMMs, etc.). Command buffers such as command buffer 126 can comprise a logical register and a phase-lock loop (PLL) to receive and re-drive command and address input signals from the memory controller 102 to the DRAM devices on a DIMM (e.g., DRAM devices $124_1$, DRAM devices $124_2$, etc.), reducing clock, control, command, and address signal loading by isolating the DRAM devices from the memory controller 102 and the system bus 110. In some cases, certain features of the command buffer 126 can be programmed with configuration and/or control settings. In one embodiment, command buffer 126 receives a number of command/address signals together with at least one clock signal from memory controller 102 via CA bus 116. As described in detail below, command buffer 126 may divide the received command/address signals into two or more separate groups and generate one or more additional clock signals from the received clock signal. The additional clock signals may be delayed by a certain offset amount with respect to the received clock signals. Command buffer 126 may further sample each of the groups of command/address signals (e.g., subsets of the received command/address signals) according to either the received clock signals or one of the delayed clock signals, respectively.

The memory module 120 shown in environment 100 presents merely one partitioning. In other embodiments, in addition or in the alternative, memory module 120 may include other volatile memory devices, such as synchronous DRAM (SDRAM), Rambus DRAM (RDRAM), static random access memory (SRAM), etc. The specific example shown where the command buffer 126 and the DRAM devices $124_1$-$124_2$ are separate components is purely exemplary, and other partitioning is possible. For example, any or all of the components comprising the memory module 120 and/or other components can comprise one device (e.g., system-on-chip or SoC), multiple devices in a single package or printed circuit board, multiple separate devices, and can have other variations, modifications, and alternatives. In addition, memory controller 102 may include additional and/or different components than those illustrated in FIG. 1. Furthermore, the illustrated components may be arranged differently depending on the embodiment.

Figure 2:
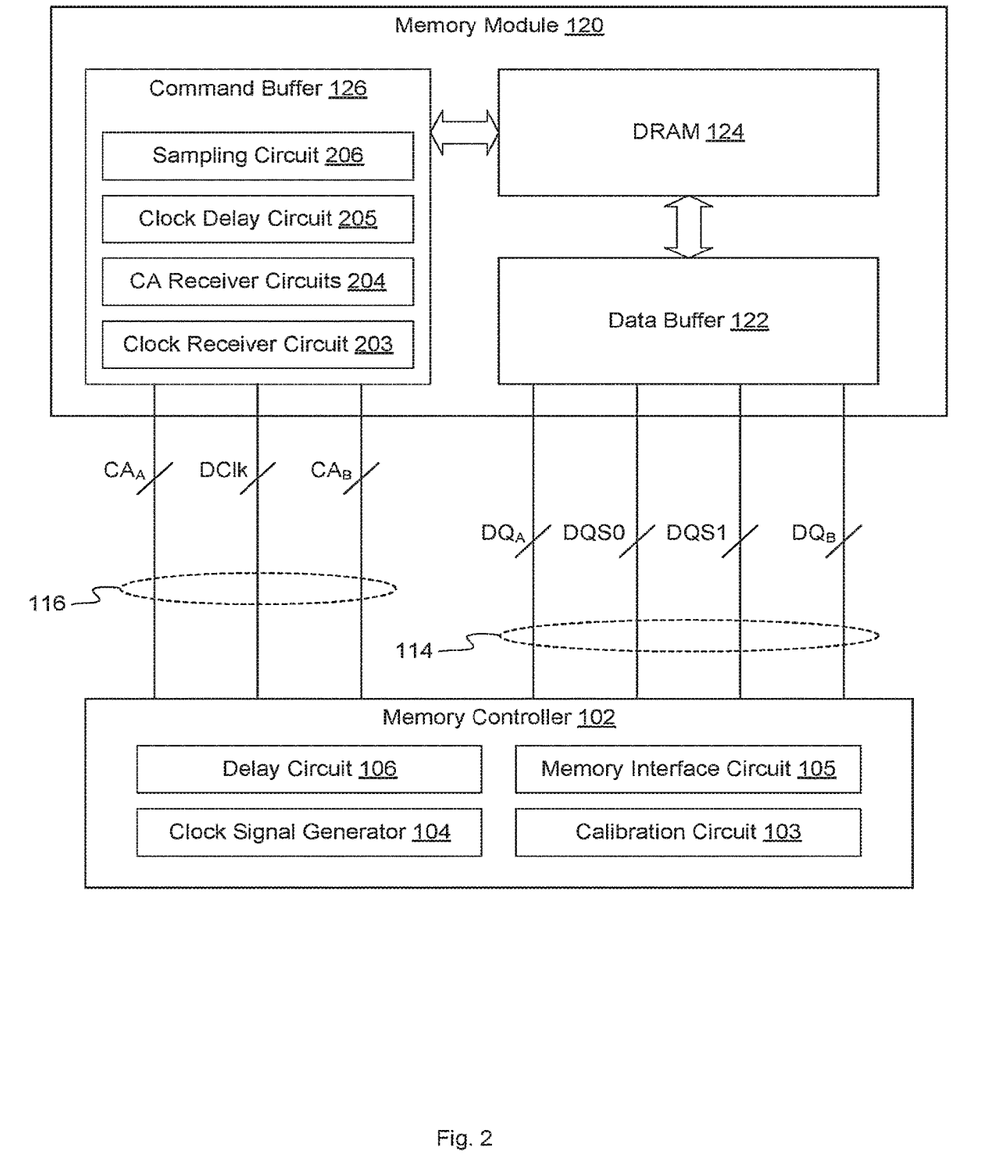
FIG. 2 is a block diagram illustrating a memory controller configured to introduce intentional skew for strobe signals provided to a memory module, according to an embodiment.
Figure 3A:
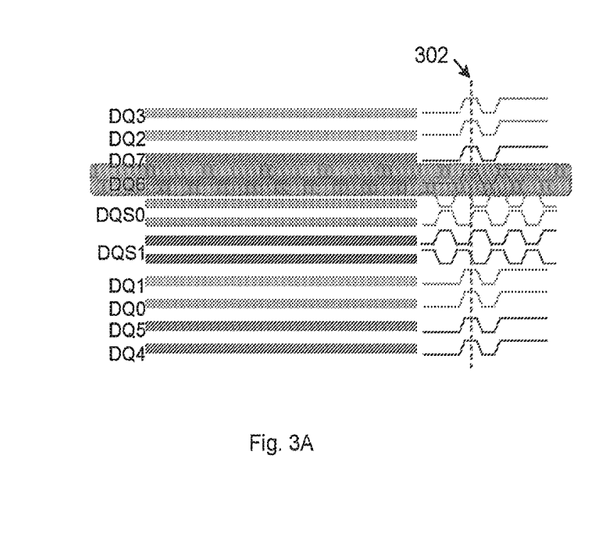
FIGS. 3A-3D are diagrams illustrating intentional skewing of strobe signals for transmitting data signals to a memory module, according to an embodiment.
Figure 3B:
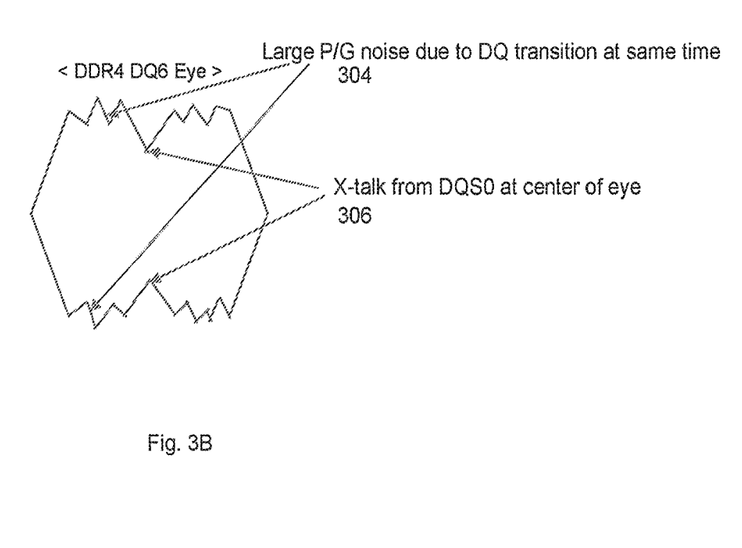
Figure 3C:
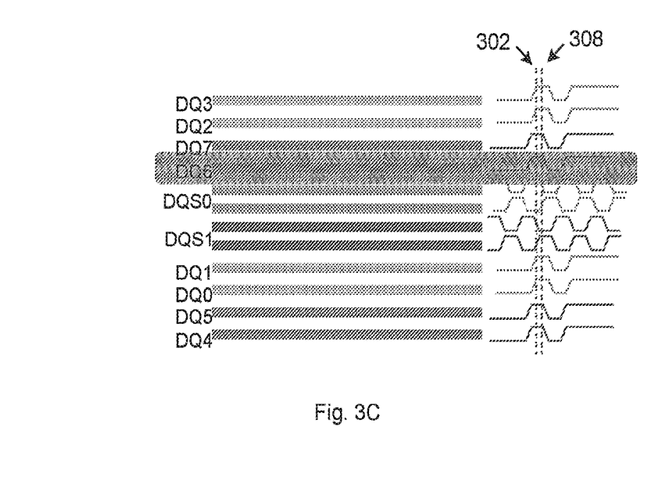

FIG. 2 is a block diagram illustrating a memory controller configured to introduce intentional skew for strobe signals provided to a memory module, according to an embodiment. As illustrated, memory controller 102 is coupled to memory module by a data bus 114 and CA bus 116. Data bus 114 may be representative of either data bus $114_1$ or data bus $114_2$, as illustrated in FIG. 1. In one embodiment, data bus 114 transmits multiple data signals DQ (e.g., $DQ_A$ and $DQ_B$) and multiple strobe signals DQS (e.g., DQS0 and DQS1). For example, $DQ_A$ may include four separate data signals, $DQ_B$ may include four additional data signals, DQS0 may include a first pair of differential strobe signals, and DQS1 may include a second pair of differential strobe signals. Thus, in one embodiment, data bus 114 includes eight data signals in total. As shown in FIGS. 3A and 3C, data signals DQ0-DQ7 may be transmitted on data bus 114, with one bit from each of the eight signals sent aligned with transitions of strobe signals DQS0 and DQS1 forming a byte of data written to the memory module 120. Each four bit aggregation (e.g., $DQ_A$ or $DQ_B$) may be referred to herein as a "nibble." In one embodiment, the four data signals DQ0-DQ3 that form $DQ_A$ use strobe signals DQS0 as a reference clock and the four data signals DQ4-DQ7 that form $DQ_B$ use strobe signals DQS1 as a reference clock. Thus, within each nibble, the four data signals are synchronized to the same strobe signal. As a result, the four data signals within each nibble are de-skewed relative to the strobe signal and are aligned to one another. In one embodiment, all of the signals in data bus 114 are received by data buffer 122 of memory module 120. In another embodiment, all of the signals in data bus 114 are received directly by DRAM device 124 of memory module 120.

FIG. 3A illustrates the pin arrangement for data bus 114 in a DDR4 system. In this embodiment, DQ and DQS pins are arranged in the sequence of DQ4, DQ5, DQ0, DQ1, DQS1, DQS0, DQ6, DQ7, DQ2, and DQ3. With this signal configuration, the first strobe signal DQS0 can cause some cross-talk (x-talk) with DQ6 and DQ7. Similar cross-talk happens between strobe signal DQS1 and DQ1 and DQ0. During a write operation, the strobe signals DQS0 and DQS1 have a 90 degree offset compared to the data signals DQ0-DQ7. FIG. 3A illustrates an embodiment where strobe signals DQS0 and DQS1 are synchronized or aligned (i.e., not skewed), and thus all of the data signals DQ0-DQ7 switch at the same point in time 302. FIG. 3B is an eye pattern diagram illustrating data signal DQ6, for example. As a result of the synchronized strobe signals, a large amount of power/ground noise 304 is observed and the eye opening (representing additive noise in the data signal DQ6) is impacted by crosstalk 306 from strobe signal DQS0.

Referring again to FIG. 2, as described above, memory controller 102 includes calibration circuit 103, clock signal generator 104, a memory interface circuit 105, and delay circuit 106. In one embodiment, clock signal generator 104 generates strobe signals DQS0 and DQS1. For example, clock signal generator 104 may include a PLL or other circuit to generate strobe signals DQS0 and DQS1. In other embodiments, clock signal generator 104 may receive one or more clock signals from a source external to the memory controller 102. Memory interface circuit 105 transmits various data signals and strobe signals to memory module 120 via data bus 114. In one embodiment, memory interface circuit 105 receives data signals from a processing device (not shown) of memory controller 102 or from some other memory client utilizing the memory system including memory controller 102 and memory module 120, and receives the strobe signals from clock signal generator 104. Memory interface circuit 105 drives the data signals (e.g., $DQ_A$ and $DQ_B$) and the strobe signals (e.g., DQS0 and DQS1) to memory module 120 over various signal lines that form data bus 114. In one embodiment, memory interface circuit 105 drives one bit of each of the data signals $DQ_A$ with either each rising or falling edge of strobe signals DQS0 and drives one bit of each of the data signals $DQ_B$ with either each rising or falling edge of strobe signals DQS1.

Figure 4:
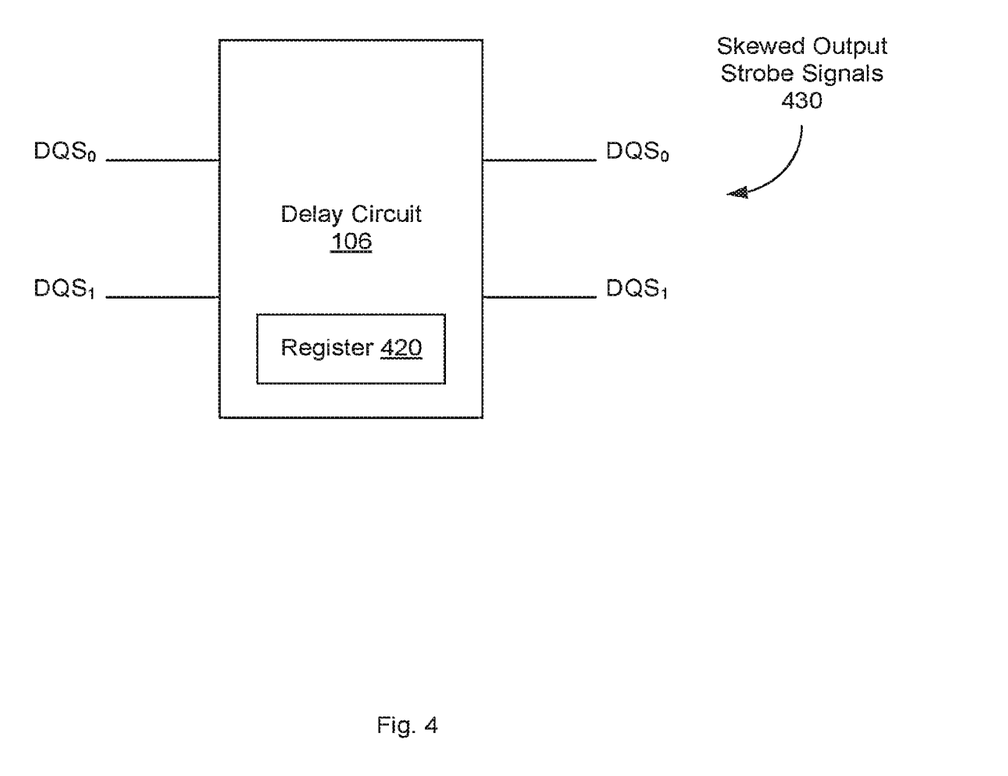
FIG. 4 is a block diagram illustrating a delay circuit for introducing intentional skew in strobe signals, according to an embodiment.

In one embodiment, delay circuit 106 introduces intentional skew for at least one of strobe signals DQS0 or DQS1. For example, delay circuit 106 may skew strobe signals DQS0 by a first offset amount with respect to strobe signals DQS1. In another embodiment, delay circuit 106 may instead skew strobe signals DQS1 by a second offset amount with respect to strobe signals DQS0. In yet another embodiment, delay circuit 106 may skew both strobe signals DQS0 and DQS1 by certain offset amounts. FIG. 4 illustrates a delay circuit 106 configured to introduce intentional skew into strobe signals DQS0 and DQS1. The offset amounts representing the amount of skew in the strobe signals DQS0 and DQS1 may be set by a value in a register 420 associated with delay circuit 106. Depending on the embodiment, the register 420 may local in proximity to delay circuit 106 itself, or may be at a location elsewhere within memory controller 102 from which delay circuit 106 can be configured by the contents of the register. In one embodiment, a processing device coupled to memory controller 102 writes a corresponding value to the associated register 420, the value representing the desired amount of signal skew to be introduced (i.e., the corresponding offset amounts) for strobe signals DQS0 and/or DQS1, which, when applied, will result in the skewed output strobe signals being generated at the output of delay circuit 106.

Figure 3D:
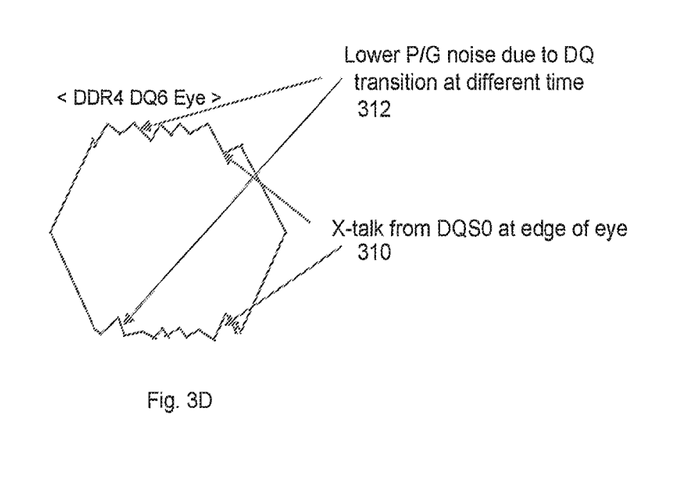

In one embodiment, calibration circuit 103 is configured to calibrate the offset amounts during a calibration operation. The calibration operation may include measuring an amount of interference attributable to the transitions in the signals propagating on the signal lines of data bus 114 corresponding to the relevant data signals $DQ_A$ or $DQ_B$. Calibration circuit 103 may measure the interference detected for a number of different offset amounts (e.g., systematically changing the offset amount by a step value) to identify an offset amount where interference is minimized or at least shifted. FIG. 3C illustrates an embodiment where skew has been applied to strobe signal DQS0. Accordingly, data signals DQ0-DQ3 now change states at time 308 (i.e., in response to a rising or falling edge of strobe signal DQS0) while data signals DQ4-DQ7 change states at time 302. As a result of decreasing or shifting the interference, when an eye pattern diagram of data signal DQ6 is generated as illustrated in FIG. 3D, cross-talk 310 from DQS0 is shifted to the edge of the eye resulting in an improved eye opening and lower P/G noise 312 due to the DQ transition at a different time. By making skew among nibble groups, the phase offset between DQ of one nibble and DQS of other nibble becomes small and cross-talk happens close to DQ transition.

Referring again to FIG. 2, CA bus 116 may be representative of CA bus 116 illustrated in FIG. 1. In one embodiment, CA bus 116 transmits multiple CA signals $CA_A$ and $CA_B$ and multiple external clock signals DClk. For example, $CA_A$ may include seven separate CA signals, $CA_B$ may include seven additional CA signals, and DClk may include a pair of differential clock signals. In one embodiment, all of the signals in CA bus 116 are received by command buffer 126 of memory module 120.

In one embodiment, clock signal generator 104 of memory controller 102 generates external clock signals DClk. Memory interface circuit 105 transmits various CA signals and external clock signals to memory module 120 via CA bus 116. In one embodiment, memory interface circuit 105 receives the CA signals from a processing device (not shown) of memory controller 102 or from some other memory client utilizing the memory system including memory controller 102 and memory module 120, and receives the external clock signals from clock signal generator 104. Memory interface circuit 105 drives the CA signals (e.g., $CA_A$ and $CA_B$) and the external clock signals (e.g., DClk) to memory module 120 over various signal lines that form CA bus 116. In one embodiment, memory interface circuit 105 drives one bit of each of the CA signals $CA_A$ and $CA_B$ with either each rising or falling edge of external clock signals DClk.

Figure 5:
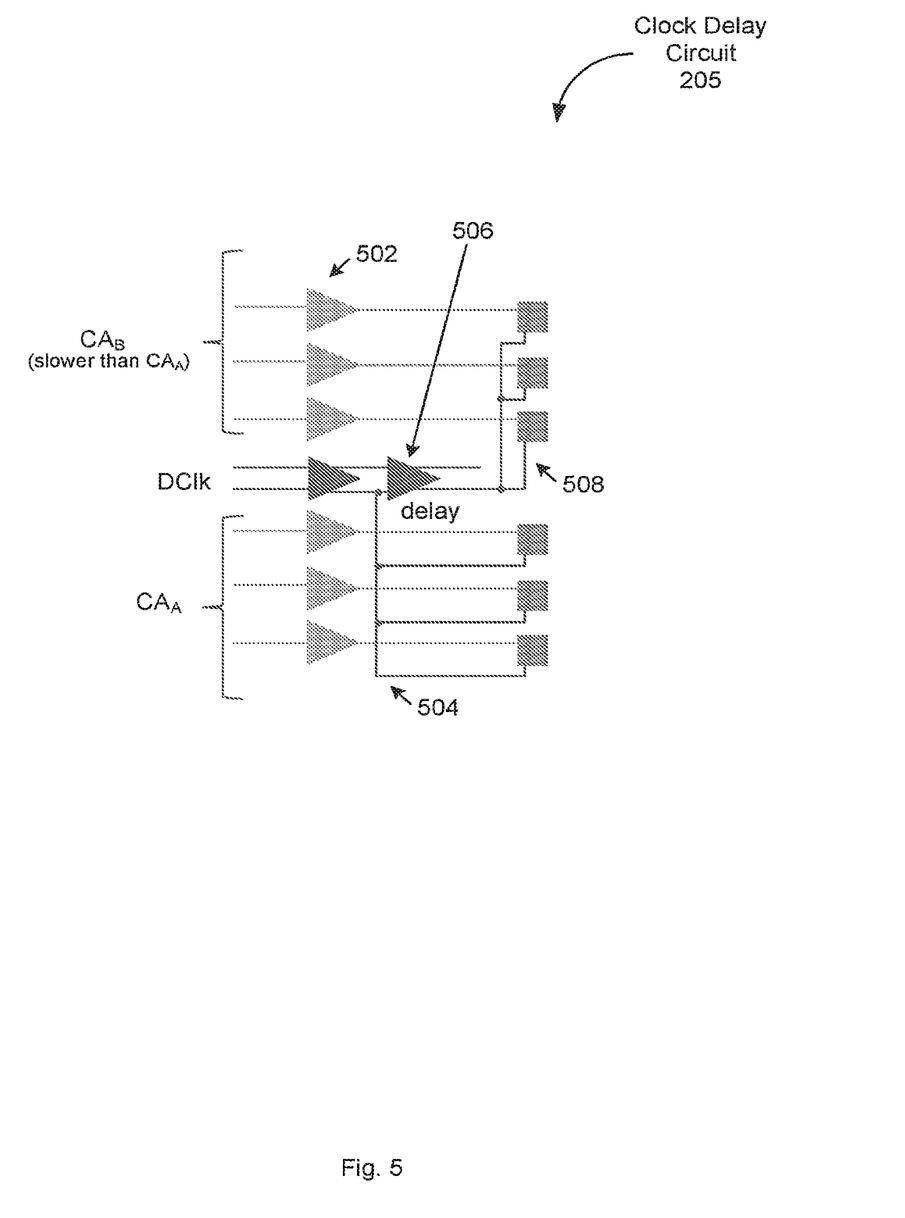
FIG. 5 is a block diagram illustrating a clock delay circuit for introducing intentional skew in strobe signals, according to an embodiment.

In one embodiment, clock receiver circuit 203 of command buffer 126 on memory module 120 receives external clock signals DClk and one or more (e.g., a plurality) of CA receiver circuits 204 of command buffer 126 receive CA signals $CA_A$ and $CA_B$ from memory controller 102. In one embodiment, clock delay circuit 205 of command buffer 126 generates additional internal clock signals $Dskew_0$ from the received external clock signals DClk. FIG. 5 illustrates an example implementation of clock delay circuit 205, according to one embodiment. In one embodiment, clock delay circuit 205 receives the CA signals $CA_A$ and $CA_B$ and external clock signals DClk, each at a corresponding input buffer 502. External clock signal DClk is used to sample 504 the first group of CA signals $CA_A$. External Clock signal DClk is further applied to a delay element 506, which introduces some amount of skew into the clock signal. The output of delay element 506 is an additional internal clock signal (i.e., $Dskew_0$) which can be used to sample 508 the second group of CA signals $CA_B$. The additional internal clock signals $Dskew_0$ may be delayed by a first offset amount with respect to the received external clock signals DClk.

Figure 6:
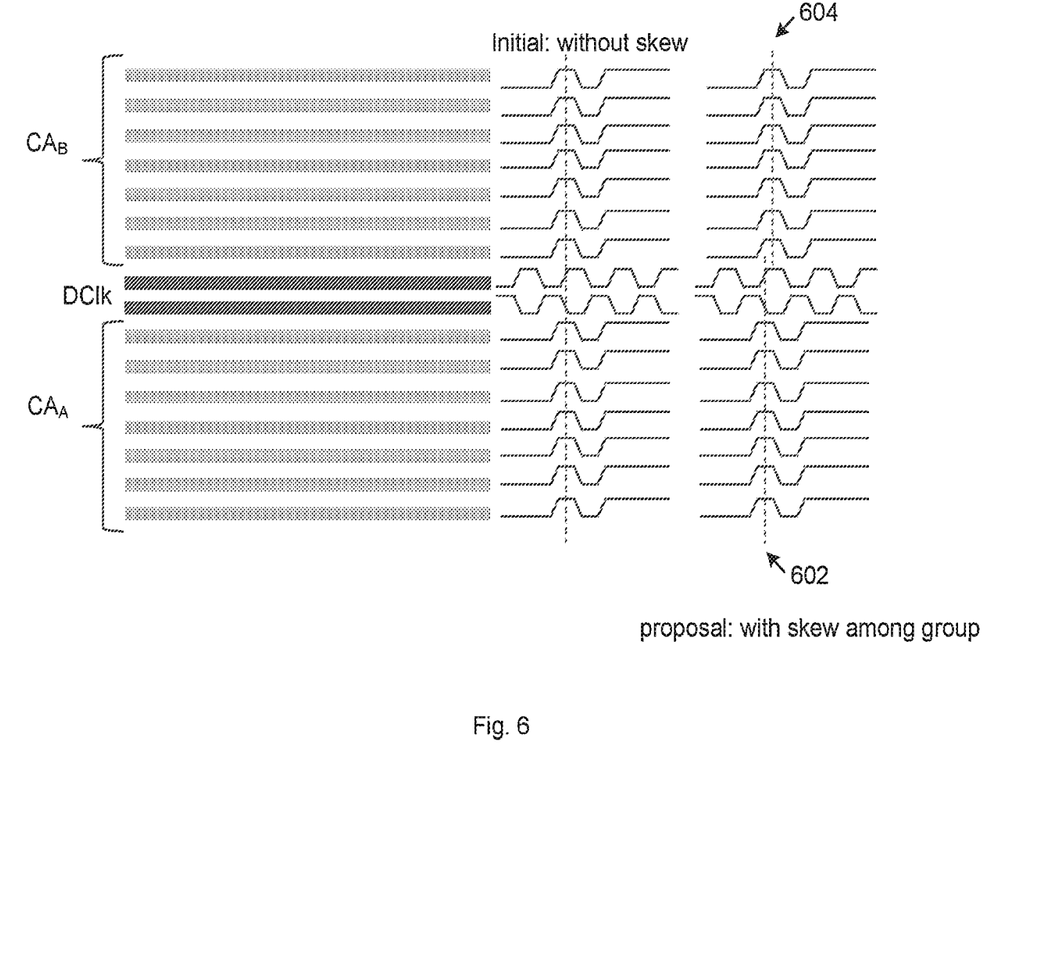
FIG. 6 is a diagram illustrating intentional skewing of strobe signals for sampling command and address signals in a memory module, according to an embodiment.

Sampling circuit 206 of command buffer 126 is configured to divide the CA signals into a number of groups (e.g., $CA_A$ and $CA_B$), sample a first group (e.g., $CA_A$) according to the received external clock signals DClk and sample a second group (e.g., $CA_B$) according to the delayed clock signals $Dskew_0$ generated by clock delay circuit 205. FIG. 6 illustrates an embodiment where skew has been applied to external clock signal DClk. Accordingly, CA signals $CA_A$ change states at time 602 (i.e., in response to a rising or falling edge of external clock signal DClk) while CA signals $CA_B$ change states at time 604 (i.e., in response to a rising or falling edge of delayed internal clock signals $Dskew_0$. In other embodiments, sampling circuit 206 can divide the CA signals into any number of two or more groups, and clock delay circuit 205 can generate additional delayed internal clock signals ($Dskew_1$, $Dskew_2$, etc.), as needed. The offset amounts representing the amount of skew in the delayed clock signal or signals may be determined by CA receiver circuits 204 which perform a calibration operation. The calibration operation may include measuring an amount of interference attributable to the transitions in the signals propagating on the signal lines of CA bus 116 corresponding to the relevant CA signals $CA_A$ or $CA_B$. CA receiver circuits 204 may measure the interference detected for a number of different offset amounts (e.g., systematically changing the offset amount by a step value) to identify an offset amount where interference is minimized or at least shifted.

Figure 7:
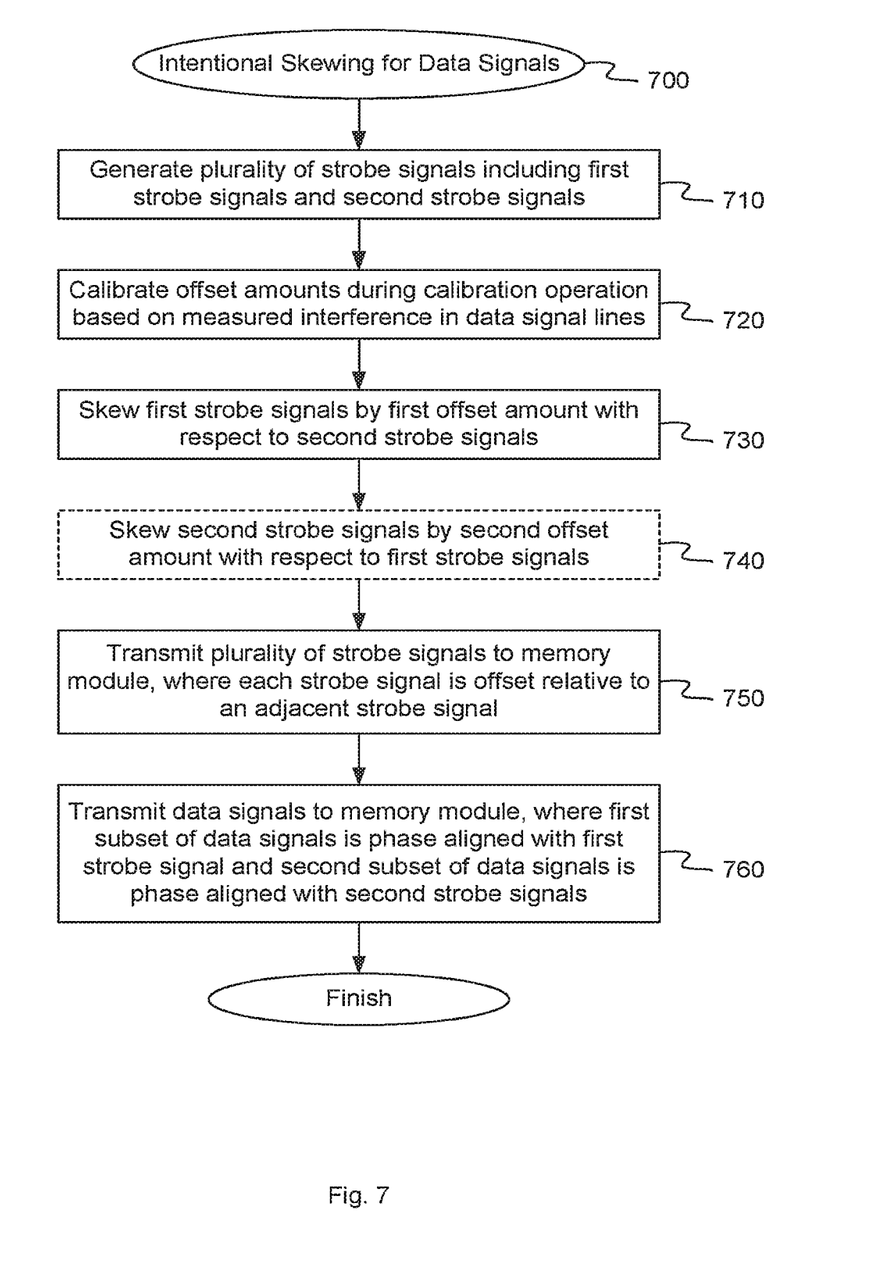
FIG. 7 is a flow diagram illustrating a method of intentional strobe signal skewing for data signals, according to an embodiment.

FIG. 7 is a flow diagram illustrating a method of intentional strobe signal skewing for data signals, according to an embodiment. The method 700 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 700 is performed by memory controller 102, as shown in FIGS. 1 and 2.

Referring to FIG. 7, at block 710, method 700 generates a plurality of strobe signals including first strobe signals and second strobe signals. In one embodiment, clock signal generator 104 of memory controller 102 generates the first and second strobe signals. Clock signal generator 104 may include a phase lock loop (PLL) or other circuit to generate one or more clock signals. In one embodiment, the first strobe signals comprise a first differential pair of clock signals and the second strobe signals comprise a second differential pair of clock signals. In another embodiment, the first and second strobe signals each include a single clock signal. In other embodiments, clock signal generator 104 may receive one or more clock signals from a source external to the memory controller 102, and utilize those received clock signals as the first and second strobe signals. In other embodiments, clock signal generator 104 may generate any number of strobe signals (e.g., third strobe signals, fourth strobe signals, etc.).

At block 720, method 700 calibrates one or more offset amounts during a calibration operation, wherein a first offset amount is based on a first amount of interference attributable to the transitions in the signals propagating on the first signal lines corresponding to a first subset of a plurality of data signals. In one embodiment, calibration circuit 103 of memory controller 102 performs the calibration operation, which may include measuring an amount of interference on the signal lines of data bus 114 corresponding to the relevant data signals $DQ_A$ or $DQ_B$. Calibration circuit 103 may measure the interference detected for a number of different offset amounts (e.g., systematically changing the offset amount by a step value) to identify an offset amount where interference is minimized or at least shifted away from the time when the data signals transition.

At block 730, method 700 skews first strobe signals by a first offset amount with respect to second strobe signals, and at block 740, method 700 optionally skews second strobe signals by a second offset amount with respect to the first strobe signals. In one embodiment, delay circuit 106 of memory controller 102 introduces intentional skew for at least one of strobe signals DQS0 or DQS1. For example, delay circuit 106 may skew strobe signals DQS0 by a first offset amount with respect to strobe signals DQS1. In another embodiment, delay circuit 106 may instead skew strobe signals DQS1 by a second offset amount with respect to strobe signals DQS0. In yet another embodiment, delay circuit 106 may skew both strobe signals DQS0 and DQS1 by certain offset amounts. In one embodiment, instead of or in addition to use of delay circuit 106, the respective signal lines used to transmit strobe signals DQS0 and DQS1 may be designed with different lengths. For example, signal lines in data bus 114 used to transmit strobe signals DQS0 may shorter than the signal lines used to transmit strobe signals DQS1, such that strobe signals DQS0 will be received at memory module before strobe signals DQS1 and the corresponding data signals will transition at different times. In another embodiment, the signals lines used to transmit strobe signals DQS1 may be shorter than the signals lines used to transmit strobe signals DQS0.

At block 750, method 700 transmits the first strobe signals and the second strobe signals to a memory module, where each strobe signal is offset relative to an adjacent strobe signal and at block 760, method 700 transmits a plurality of data signals to the memory module. In one embodiment, memory interface circuit 105 of memory controller 102 transmits various data signals and strobe signals to memory module 120 via data bus 114. In one embodiment, memory interface circuit 105 receives the data signals DQ0-DQ7 from a processing device of memory controller 102 or from some other memory client utilizing the memory system including memory controller 102 and memory module 120, and receives the strobe signals from clock signal generator 104. Memory interface circuit 105 drives the data signals and the strobe signals to memory module 120 over various signal lines that form data bus 114. In one embodiment, memory interface circuit 105 drives one bit of each of the data signals $DQ_A$ with either each rising or falling edge of strobe signals DQS0 and drives one bit of each of the data signals $DQ_B$ with either each rising or falling edge of strobe signals DQS1. As a result of the skew introduced at blocks 730 and/or 740, a first subset of the plurality of data signals is phase aligned with the first strobe signals DQS0, and a second subset of the plurality of data signals, is phase aligned with the second strobe signals DQS1. As a result, although the four data signals within the first subset are all aligned with DQS0, and thus with each other, those four data signals are offset from the four data signals in the second subset, which are aligned with DQS1.

Figure 8:
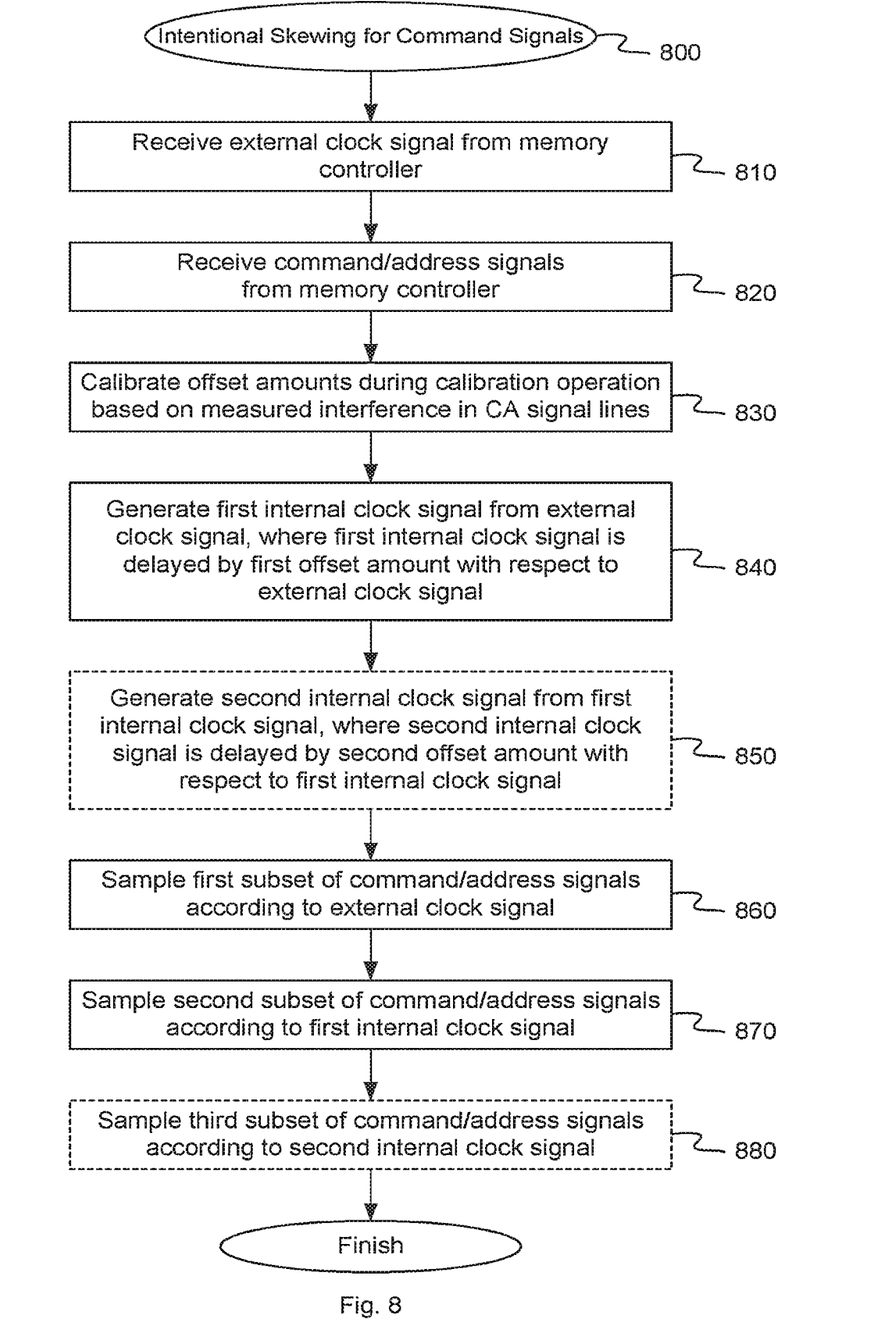
FIG. 8 is a flow diagram illustrating a method of intentional strobe signal skewing for command and address signals, according to an embodiment.

FIG. 8 is a flow diagram illustrating a method of intentional clock signal skewing for command and address signals, according to an embodiment. The method 700 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 800 is performed by command buffer 126, as shown in FIGS. 1 and 2.

Referring to FIG. 8, at block 810, method 800 receives an external clock signal (e.g., a differential pair of signals) from a memory controller coupled to the memory module, and at block 820, method 800 receives a plurality of command/address signals from the memory controller. In one embodiment, clock receiver circuit 203 of command buffer 126 on memory module 120 receives clock signals DClk and one or more (e.g., a plurality) of CA receiver circuits 204 of command buffer 126 receive CA signals $CA_A$ and $CA_B$ from memory controller 102. The plurality of command/address signals can convey a memory access command and an associated address in DRAM 124.

At block 830, method 800 calibrate one or more offset amounts during a calibration operation, wherein a first offset amount is based on a first amount of interference measured on first signal lines corresponding to a second subset of the plurality of command/address signals. The offset amounts representing the amount of skew in the delayed clock signal or signals may be determined by CA receiver circuits 204 which perform a calibration operation. The calibration operation may include measuring an amount of interference on the signal lines of CA bus 116 corresponding to the relevant CA signals $CA_A$ or $CA_B$. CA receiver circuits 204 may measure the interference detected for a number of different offset amounts (e.g., systematically changing the offset amount by a step value) to identify an offset amount where interference is minimized or at least shifted.

At block 840, method 800 generates a first internal clock signal from the external clock signal, wherein the first internal clock signal is delayed by a first offset amount with respect to the external clock signal, and at block 850, method 800 optionally generates a second internal clock signal from the first internal clock signal, wherein the second internal clock signal is delayed by a second offset amount with respect to the first internal clock signal. In one embodiment, clock delay circuit 205 of command buffer 126 generates additional internal clock signals $Dskew_0$ from the received external clock signals DClk. In one embodiment, clock delay circuit 205 receives the CA signals $CA_A$ and $CA_B$ and external clock signals DClk. External clock signal DClk is used to sample the first group of CA signals $CA_A$ and is further applied to a delay element 506, which introduces some amount of skew into the external clock signal. The output of delay element 506 is an internal clock signal (i.e., $Dskew_0$) which can be used to sample the second group of CA signals $CA_B$. The internal clock signal $Dskew_0$ may be delayed by a first offset amount with respect to the received external clock signals DClk. The clock delay circuit 205 may further include an additional number of delay elements which can further skew the internal clock signals to generate additional internal clock signals for clocking additional groups of CA signals.

At block 860, method 800 samples a first subset of the plurality of command/address signals according to the external clock signals, at block 870, method 800 samples a second subset of the plurality of command signals according to the first internal clock signals, and at block 880, method 800 optionally samples a third subset of the plurality of command signals according to the second internal clock signals. In one embodiment, sampling circuit 206 of command buffer 126 is configured to divide the CA signals into a number of groups (e.g., $CA_A$ and $CA_B$), sample a first group (e.g., $CA_A$) according to the received external clock signals DClk and sample a second group (e.g., $CA_B$) according to the delayed internal clock signals $Dskew_0$ generated by clock delay circuit 205. In other embodiments, sampling circuit 206 can divide the CA signals into any number of two or more groups, and clock delay circuit 205 can generate additional delayed internal clock signals ($Dskew_1$, $Dskew_2$, etc.), as needed.

Although the operations of the methods herein are shown and described in a particular order, the order of the operations of each method may be altered so that certain operations may be performed in an inverse order or so that certain operation may be performed, at least in part, concurrently with other operations. In certain implementations, instructions or sub-operations of distinct operations may be in an intermittent and/or alternating manner.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

In the above description, numerous details are set forth. It will be apparent, however, to one skilled in the art, that the aspects of the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving," "determining," "selecting," "storing," "setting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMS, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description. In addition, aspects of the present disclosure are not described with reference to any particular programming language. It will be appreciated that a variety of programming languages may be used to implement the teachings of the present disclosure as described herein.

Aspects of the present disclosure may be provided as a computer program product, or software, that may include a machine-readable medium having stored thereon instructions, which may be used to program a computer system (or other electronic devices) to perform a process according to the present disclosure. A machine-readable medium includes any procedure for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.).

What is claimed is:

1. A memory module comprising:
one or more memory devices; and
a command buffer coupled to the one or more memory devices, the command buffer comprising:
  a clock receiver circuit configured to receive an external clock signal from a memory controller, the clock receiver circuit to generate a first internal clock signal from the external clock signal;
  a plurality of receiver circuits configured to receive a plurality of command/address signals from the memory controller, the plurality of command/address signals to convey a memory access command and an address;
  a clock delay circuit configured generate a second internal clock signal from the first internal clock signal, wherein the second internal clock signal is delayed by a first offset amount with respect to the first internal clock signal; and
  a sampling circuit configured to sample a first subset of the plurality of command/address signals according to the first internal clock signal and to sample a second subset of the plurality of command signals according to the second internal clock signal.

2. The memory module of claim 1, wherein the plurality of receiver circuits are further configured to:
calibrate the first offset amount during a calibration operation, wherein the first offset amount is based on a first amount of interference attributable to transitions in the second subset of the plurality of command/address signals propagating on first signal lines.

3. The memory module of claim 1, wherein to generate the second internal clock signal from the first internal clock signal, the command buffer is configured to apply the first internal clock signal to the clock delay circuit, and wherein an output of the clock delay circuit comprises the second internal clock signal.

4. The memory module of claim 1, wherein the clock delay circuit is further configured to:
generate a third internal clock signal from the second internal clock signal, wherein the third internal clock signal is delayed by a second offset amount with respect to the second internal clock signal.

5. The memory module of claim 4, wherein the sampling circuit is further configured to:
sample a third subset of the plurality of command signals according to the third internal clock signal.

6. The memory module of claim 1, wherein the one or more memory devices comprise dynamic random access memory (DRAM) devices.

7. The memory module of claim 1, wherein the memory module comprises a dual-in line memory module (DIMM).

8. A method of operation of a memory module, the method comprising:
receiving, at a clock receiver circuit, an external clock signal from a memory controller;
generating, by the clock receiver circuit, a first internal clock signal from the external clock signal;
receiving, at a plurality of receiver circuits, a plurality of command/address signals from the memory controller, the plurality of command/address signals to convey a memory access command and an address;
generating, by a clock delay circuit, a second internal clock signal from the first internal clock signal, wherein the second internal clock signal is delayed by a first offset amount with respect to the first internal clock signal;
sampling, by a sampling circuit, a first subset of the plurality of command/address signals according to the first internal clock signal; and
sampling, by the sampling circuit, a second subset of the plurality of command signals according to the second internal clock signal.

9. The method of claim 8, further comprising:
calibrating, by the plurality of receiver circuits, the first offset amount during a calibration operation, wherein the first offset amount is based on a first amount of interference attributable to transitions in the second subset of the plurality of command/address signals propagating on first signal lines.

10. The method of claim 8, wherein generating the second internal clock signal from the first internal clock signal comprises applying the first internal clock signal to the clock delay circuit, and wherein an output of the clock delay circuit comprises the second internal clock signal.

11. The method of claim 8, further comprising:
generating, by the clock delay circuit, a third internal clock signal from the second internal clock signal, wherein the third internal clock signal is delayed by a second offset amount with respect to the second internal clock signal.

12. The method of claim 11, further comprising:
sampling, by the sampling circuit, a third subset of the plurality of command signals according to the third internal clock signal.

13. The method of claim 8, wherein the memory module comprises a dual-in line memory module (DIMM).

14. An command buffer comprising:
a clock receiver circuit configured to receive an external clock signal from a memory controller, the clock receiver circuit to generate a first internal clock signal from the external clock signal;
a plurality of receiver circuits configured to receive a plurality of command/address signals from the memory controller, the plurality of command/address signals to convey a memory access command and an address;
a clock delay circuit configured generate a second internal clock signal from the first internal clock signal, wherein the second internal clock signal is delayed by a first offset amount with respect to the first internal clock signal; and
a sampling circuit configured to sample a first subset of the plurality of command/address signals according to the first internal clock signal and to sample a second subset of the plurality of command signals according to the second internal clock signal.

15. The command buffer of claim 14, wherein the plurality of receiver circuits are further configured to:
calibrate the first offset amount during a calibration operation, wherein the first offset amount is based on a first amount of interference attributable to transitions in the second subset of the plurality of command/address signals propagating on first signal lines.

16. The command buffer of claim 14, wherein to generate the second internal clock signal from the first internal clock signal, the command buffer is configured to apply the first internal clock signal to the clock delay circuit, and wherein an output of the clock delay circuit comprises the second internal clock signal.

17. The command buffer of claim 14, wherein the clock delay circuit is further configured to:
generate a third internal clock signal from the second internal clock signal, wherein the third internal clock signal is delayed by a second offset amount with respect to the second internal clock signal.

18. The command buffer of claim 17, wherein the sampling circuit is further configured to:
sample a third subset of the plurality of command signals according to the third internal clock signal.

19. The command buffer of claim 14, wherein the command buffer is coupled to one or more memory devices.

20. The command buffer of claim 14, wherein the command buffer is disposed within a dual-in line memory module (DIMM).

* * * * *